United States Patent
Maeda

(10) Patent No.: US 7,446,313 B2
(45) Date of Patent: Nov. 4, 2008

(54) SCANNING ELECTRON MICROSCOPE

(75) Inventor: Tatsuya Maeda, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 140 days.

(21) Appl. No.: 11/357,020

(22) Filed: Feb. 21, 2006

(65) Prior Publication Data
US 2006/0188216 A1 Aug. 24, 2006

(30) Foreign Application Priority Data
Feb. 23, 2005 (JP) ............................. 2005-047724

(51) Int. Cl.
H01J 37/28 (2006.01)
(52) U.S. Cl. .................. 250/310; 250/311; 250/306; 250/307
(58) Field of Classification Search ................ 250/310, 250/311, 306, 307, 397
See application file for complete search history.

(56) References Cited

U.S. PATENT DOCUMENTS

| 6,091,249 | A  | * | 7/2000  | Talbot et al. ............... 324/751 |
| 6,521,891 | B1 | * | 2/2003  | Dotan et al. ................ 250/310 |
| 6,570,156 | B1 | * | 5/2003  | Tsuneta et al. .............. 250/311 |
| 6,774,364 | B2 | * | 8/2004  | Takagi ....................... 250/310 |
| 7,088,426 | B2 | * | 8/2006  | Hirukawa et al. ............. 355/55 |
| 7,154,090 | B2 | * | 12/2006 | Kawada et al. .............. 250/310 |
| 2003/0193025 | A1 | * | 10/2003 | Takagi ....................... 250/310 |
| 2004/0222375 | A1 | * | 11/2004 | Kimura et al. .............. 250/310 |
| 2005/0024612 | A1 | * | 2/2005  | Hirukawa et al. ............. 355/55 |
| 2005/0146714 | A1 | * | 7/2005  | Kitamura et al. ......... 356/237.2 |
| 2005/0253067 | A1 | * | 11/2005 | Kawada et al. .............. 250/310 |

FOREIGN PATENT DOCUMENTS
JP 2003-17378 1/2003

* cited by examiner

Primary Examiner—David A Vanore
Assistant Examiner—Johnnie L Smith, III
(74) Attorney, Agent, or Firm—Antonelli, Terry, Stout & Kraus, LLP.

(57) ABSTRACT

It is facilitated in a scanning electron microscope to save the labor of executing the reproduction test, conduct basic analysis on a problem caused in execution of the automatic observation process, and confirm details resulting in the error. Upon detecting an error from an abnormality, the scanning electron microscope extracts a sample image Im(t2) obtained by retroceding from a sample image Im(te) stored so as to be associated with time te of error occurrence by a predetermined video quantity (for example, total recording time period t2) previously set and registered by an input-output device, from sample images stored in a recording device while being overwritten, and stores a resultant sample image in another recording device.

6 Claims, 5 Drawing Sheets

FIG.5
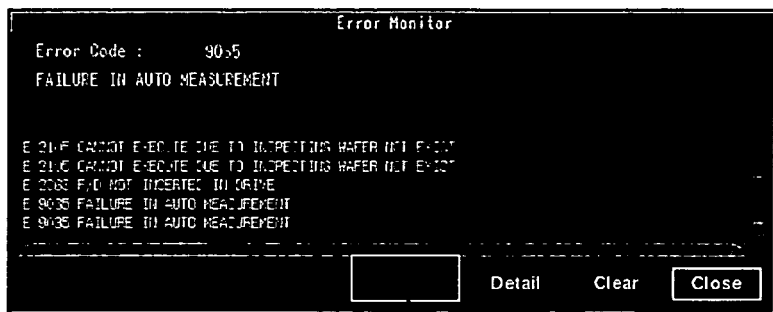
FIG.6
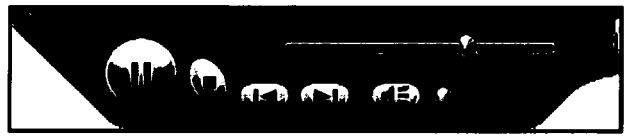
FIG.7

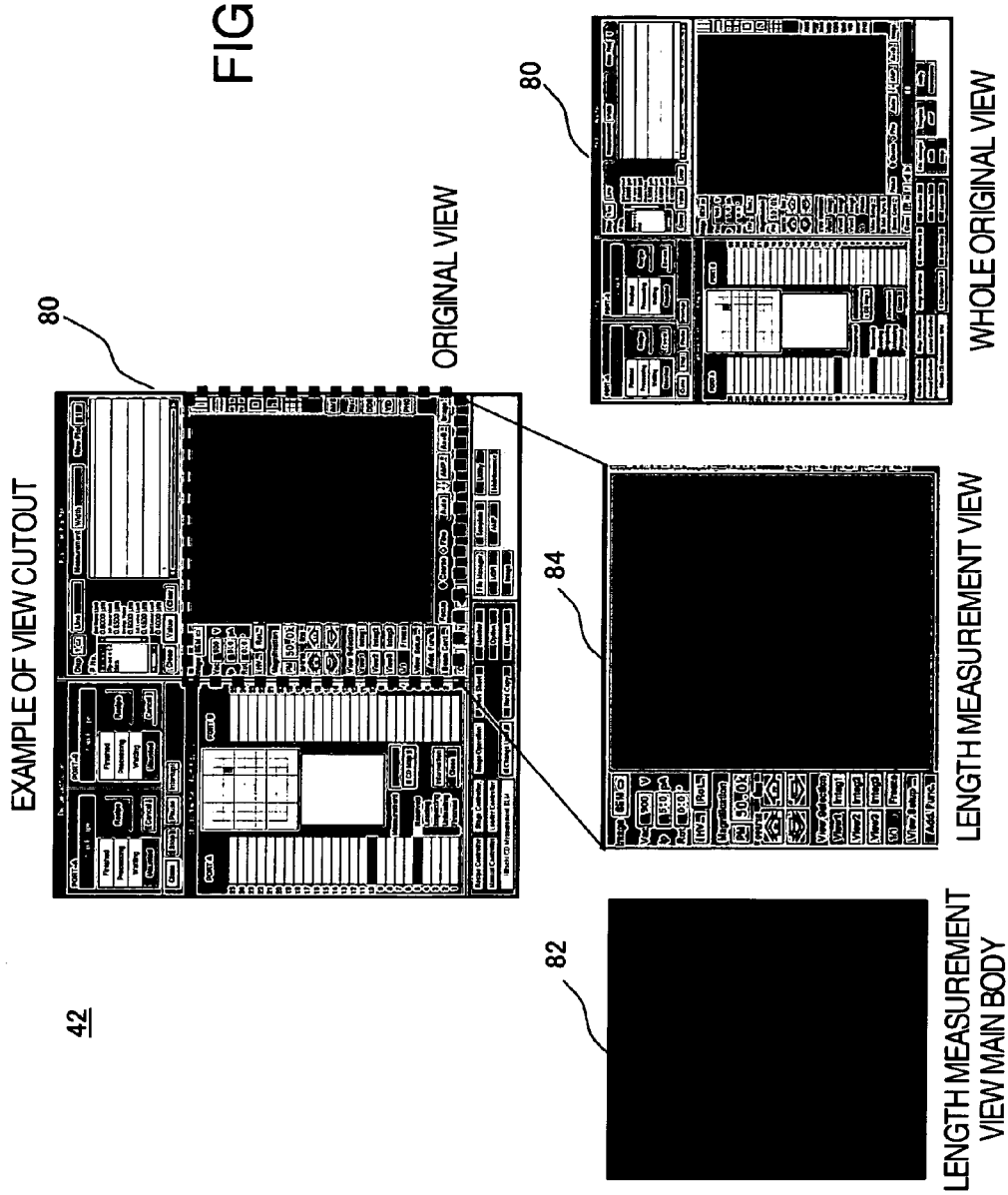

SCANNING ELECTRON MICROSCOPE

BACKGROUND OF THE INVENTION

The present invention relates to a scanning electron microscope which detects a signal generated from a sample by scanning irradiation of an electron beam and forms a scanning image of a sample (sample image). In particular, the present invention relates to a scanning electron microscope suitable for an automatic observation process, such as a CD (Critical Dimension) measurement process of a predetermined portion on a sample and an inspection process of a dust particle or a defect on the sample.

As integration of semiconductor elements advances in recent years, the scanning electron microscope (SEM) is applied to measurement and inspection of fine circuit patterns. For example, the scanning electron microscope is also applied to CD measurement of a specific pattern of a chip formed on a wafer in a semiconductor manufacturing line.

In such a scanning electron microscope applied to the CD measurement process in the semiconductor manufacturing line, automation is promoted to prevent a person from generating dust and enhance the processing capability in the same way as other constituent devices in the semiconductor manufacturing line.

In order to conduct CD measurement on a target pattern (specific pattern) on a wafer by using a scanning electron microscope, the conventional scanning electron microscope executes the following observation process as the CD measurement process.

(1) After a sample (for example, a wafer having a chip formed thereon) is carried in a sample chamber, the stage is moved to an alignment point. Alignment (aligning a coordinate system on the wafer with a coordinate system that the stage in the apparatus has) is conducted on the sample carried in to conduct global alignment.

(2) The stage is moved to a previously registered measurement point. The measurement point is detected at low magnification.

(3) Focusing is executed to adjust the focal length of the object lens so as to obtain a scanning image at the detected measurement point with an optically optimum beam diameter. Thereafter, the magnification is set to a measurement magnification (high magnification).

(4) A place to be subject to length measurement is detected from an obtained sample image on the basis of a previously registered reference template.

(5) The CD measurement is executed on the detected place to be subject to the length measurement.

In the scanning electron microscope, a series of sequences such as the sample conveyance, the alignment, the pattern detection at the measurement point, the focusing and the length measurement is previously registered as a program in order to conduct the observation process including the sequences (1) to (5) automatically. At the time of automatic operation, control means (a computer) reads out this program file from a recording device, and executes the observation process including the series of sequences automatically. In general, a program file for executing the observation process including the series of sequences is called recipe.

For example, in the case of the recipe of the CD measurement process in the above-described semiconductor manufacturing line, basic information (the measurement condition) required for the measurement, such as the alignment point position, measurement point position and measurement magnification, and image information and signal information (referred to as template) including a characteristic pattern which serves as a guide for detecting the accurate position and CD at the measurement point are registered in the recipe.

The detection of the alignment point position and the measurement point position is conducted using a technique (the so-called template matching) of comparing image information or signal information actually obtained from the sample on the basis of execution of an acquisition instruction contained in the algorithm of a series of processes when the series of processes based on the recipe is executed, with the template in the recipe, and finding a place having the strongest resemblance.

In the scanning electron microscope applied to the automatic observation process such as the above-described CD measurement process, the automatic observation process is conducted in accordance with the previously registered recipe. In some cases, however, the execution of the observation process including the series of sequences fails.

For example, if the measurement point coordinates or alignment point coordinates registered in the recipe are unsuitable, then information corresponding to image information of the actually obtained sample image is not present in the template image information (reference template), and consequently it becomes impossible to conduct the pattern detection.

On the contrary, also in the case where the signal information or the image information of the sample image obtained at the time of execution of the recipe is made different from the template by a change in the sample generation process, it becomes impossible to conduct the pattern detection.

If the signal quantity of the pattern used in auto-focusing is not sufficient, the focusing fails.

Such execution errors in the automatic observation process can be classified into the following three categories: (1) the case where the recipe generation method is unsuitable; (2) the case where the sample generation process changes and the measured pattern shape is not supposed at the time of recipe registration; and (3) the case where an error is caused by a defect in the algorithm for the series of processes executed on the basis of the recipe.

In any case, a suitable countermeasure must be taken to use the scanning electron microscope according to the purpose. Therefore, it is necessary to first analyze the failure cause.

As its analysis technique, it is necessary in the conventional technique to prepare a sample in which an error is likely to occur and a recipe for which a failure has occurred in order to reproduce the failure, and conduct an experiment for reproducing the problem by using the sample and the recipe.

In the experiment for reproducing this problem, causes of the error which has caused the failure are classified into (a) sequence, (b) image, (c) operation of the recipe, and (d) situations of image and hardware, and confirmation is conducted.

As regards the execution of the experiment for reproducing the problem, however, (p) the sample, (q) the apparatus, (r) the recipe, and (s) the operator are needed. In addition, if the event of the problem does not occur immediately even if the experiment is executed, it is necessary to repetitively execute the experiment until the event can be reproduced. During that time period, the items (p) to (s) cannot be used for the original purpose.

In another analysis technique heretofore executed, a sample image obtained when an error has occurred is preserved and the cause of the error is presumed on the basis of the sample image.

For example, a semiconductor processing apparatus described in JP-A-2003-17378 has a configuration in which a measurement control unit controls a measurement unit for measuring a pattern on a semiconductor substrate and an image pickup unit including a camera to pick up an image of the pattern on the semiconductor substrate by executing a measurement process according to a recipe. In addition, in the semiconductor processing apparatus, the measurement control unit controls the image pickup unit on the basis of an acquisition instruction contained in an algorithm of the measurement process based on a recipe. An image of a moving picture is picked up by a camera. The moving picture is stored in a memory. Thereafter, when the measurement process is finished, the moving picture stored in the memory is recorded on a disk for moving picture.

SUMMARY OF THE INVENTION

However, the semiconductor processing apparatus described in JP-A-2003-17378 has a configuration only for picking up an image of the pattern on the semiconductor substrate while the measurement unit is measuring the pattern on the semiconductor substrate after the measurement stage has moved the semiconductor substrate so as to position the camera on a measurement point specified by the recipe main body, storing a resultant moving picture in a temporary storing memory, and recording the moving picture in association with whether error occurrence is present when the measurement process is finished. If the semiconductor processing apparatus disclosed in JP-A-2003-17378 is applied to the automatic observation process using the scanning electron microscope, therefore, only the moving picture of the sample image specified to be acquired to execute the individual automatic process such as the alignment, the pattern detection at the measurement point, the focusing and the length measurement has been preserved by the automatic observation process algorithm regardless of whether an error occurs, even when an error has occurred. Therefore, moving pictures before the acquisition of the moving picture of the sample image specified to be acquired to execute the individual automatic process by the algorithm for the automatic observation process is started or after the acquisition of the moving picture of the sample image specified to be acquired to execute the individual automatic process is temporarily finished are not recorded. As a result, details resulting in the error occurrence cannot be confirmed. As regards a failure for which the information of details resulting in the error occurrence becomes necessary, sufficient analysis cannot be conducted.

In the scanning electron microscope, therefore, it is also conceivable to pick up all images of the sample that can be acquired during the operation of the apparatus and record them, unconditionally. However, it is not practical to continue to record the moving picture of the sample image inclusive of unnecessary portions during the execution of the recipe. There is a problem that not only the capacity of the recording device for recording the moving picture of the sample image obtained as the measurement result increases but also the labor and time period required to confirm the details resulting in the error occurrence also increase.

The present invention has been achieved in order to solve the above-described problems. The present invention relates to a scanning electron microscope applied to the automatic observation process. An object of the present invention is to provide a scanning electron microscope that makes it possible to save the labor of executing the reproduction test as a technique for analyzing an error, conduct basic analysis on a problem caused in execution of the automatic observation process, and confirm details resulting in the error easily and rapidly.

In accordance with the present invention, in a scanning electron microscope including an electro-optical system for scanning and irradiating top of a sample with an electron beam, a detection system for detecting a signal generated from a sample by the scanning and irradiation with the electron beam conducted by the electro-optical system, and automatic observation control means for controlling operation of the electro-optical system and executing an automatic observation process of the sample by using the detection system in accordance with a previously registered recipe, the scanning electron microscope includes image generation means for generating a sample image on the basis of a detected signal supplied from the detection system, image storage means for successively storing the sample image generated by the image generation means, and recording the sample image corresponding to a predetermined video quantity while successively overwriting the sample image, error image recording means for recording the sample image transferred from the image storage means, and recording control means responsive to an error in execution conducted by the automatic observation control means, for going back in the sample image successively stored in the image storage means before occurrence of the execution error included in the sample image successively stored in the image storage means, from time of the occurrence of the execution error by a predetermined video quantity, and recording the sample image in the error image recording means.

In a scanning electron microscope according to the present invention, when going back from the occurrence time of the error, which has occurred during execution conducted by the automatic observation control means, by a predetermined video quantity, and recording the sample image in the error image recording means, the recording control means records the sample image in association with recording of observation conditions of the automatic observation process that is being executed at the time of error occurrence of the execution conducted by the automatic observation control means.

In a scanning electron microscope according to the present invention, when going back from the occurrence time of the error, which has occurred during execution conducted by the automatic observation control means, by a predetermined video quantity, and recording the sample image in the error image recording means, the recording control means records the sample image in association with recording of error information concerning the execution error that has occurred.

A scanning electron microscope according to the present invention includes perusal control means for reading out the sample image recorded in the error image recording means and supplying a reproduced output of the sample image to display means, or especially perusal control means for reading out a sample image corresponding to specified error information from among sample images recorded in the error image recording means, and supplying a reproduced output of the sample image to display means.

According to the scanning electron microscope of the present invention, it becomes possible to confirm the cause of an error that has occurred during execution of the automatic observation process according to the recipe, by using a video image recorded when the error has occurred and preserved in the error image recording means, without reproducing the problem by using the apparatus, sample, recipe and operator unlike the conventional technique. As a result, the labor required to reproduce the error phenomenon can be reduced. In addition, basis analysis of the problem that occurs in the execution of the automatic observation process can be conducted, and it is facilitated to confirm the error process.

In addition, as for the video image recorded when the error has occurred as well, it is not restricted to the moving picture of the sample image specified to be acquired to execute the individual automatic process by an algorithm for the automatic observation process. The recording control means retrocedes in the sample image successively stored in the image storage means before occurrence of the execution error included in the sample image successively stored in the image storage means while being overwritten, from time of the occurrence of the execution error by a predetermined video quantity, and records the sample image in the error image recording means. As a result, the sample image obtained before the acquisition of the moving picture for executing the individual automatic process is started by the algorithm for the automatic observation process according to the recipe and the sample image obtained after the acquisition of the moving picture for executing the individual automatic process is temporarily finished are also recorded as a series of moving pictures for confirming the cause at the time of error occurrence, and they can be reproduced. Accordingly, it is further facilitated to confirm the details resulting in the error.

As for the acquired series of moving pictures as well, unnecessary portions having no relations to the confirmation of the error process at all can be removed previously before recording by suitably setting the video quantity of the retroactivity. As a result, it is also helpful in expediting the confirmation work.

Other objects, features and advantages of the invention will become apparent from the following description of the embodiments of the invention taken in conjunction with the accompanying drawings.

BRIEF DESCRIPTION OF THE DRAWINGS

FIG. 5 shows an example of an error monitor view displayed when automatic length measurement in the CD measurement process using the scanning electron microscope according to the present embodiment has failed;

FIG. 6 shows an example of a menu view for moving picture reproduction of an error image in the scanning electron microscope according to the present embodiment;

FIG. 7 is an error log display view of all errors that have occurred in the automatic observation process conducted using the scanning electron microscope according to the embodiment; and FIG. 8 is a diagram showing an example of an original display view displayed as an output during execution of the automatic observation process on a display device serving as an input/output device in a scanning electron microscope according to another embodiment of the present invention.

DESCRIPTION OF THE EMBODIMENTS

Hereafter, a scanning electron microscope 100 according to an embodiment of the present invention will be described with reference to the drawings.

Figure 1:
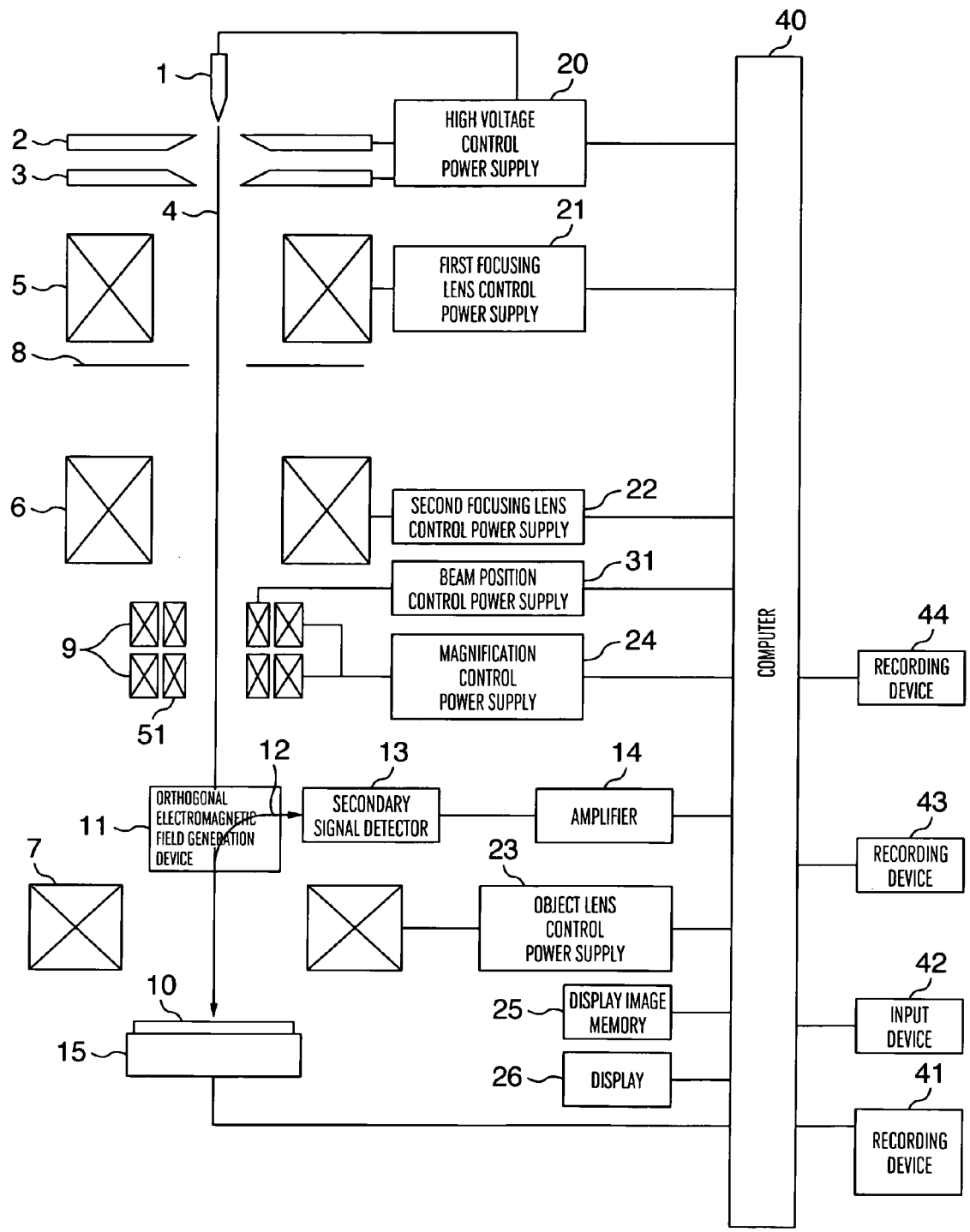
FIG. 1 is a schematic configuration diagram of a scanning electron microscope according to an embodiment of the present invention.

FIG. 1 is a schematic configuration diagram of a scanning electron microscope according to an embodiment of the present invention.

A voltage from a high voltage control power supply 20 controlled by a computer 40 is applied between a cathode 1 and a first anode 2. A primary electron beam 4 is extracted from the cathode 1 with a predetermined emission current.

An acceleration voltage is applied between the cathode 1 and a second anode 3 by the high voltage control power supply 20 which is controlled by the CPU 40. Thus, the primary electron beam 4 emitted from the cathode 1 is accelerated to advance to a lens system in a subsequent stage.

The primary electron beam 4 is focused by a first focusing lens (beam focusing means) 5, which is controlled by a first focusing lens control power supply 21. An unnecessary region of the primary electron beam 4 is removed by a diaphragm plate 8. Thereafter, the primary electron beam 4 is focused on a sample 10 held on a sample stage 15 as a minute spot by a second focusing lens 6 controlled by a second focusing lens control power supply 22 and an object lens 7 controlled by an object lens control power supply 23.

In this case, the object lens can take various forms such as an in-lens system, an out-lens system and a snorkel system (semi-in-lens system). Furthermore, a retarding system which applies a negative voltage to the sample 10 and decelerates the primary electron beam 4 is also possible. In addition, each lens may be an electrostatic lens formed of a plurality of electrodes.

The top of the sample 10 is scanned two-dimensionally by the primary electron beam 4 according to a scanning coil 9 controlled by a magnification control power supply 24. A signal of the scanning coil 9 is controlled by the magnification control power supply 24 according to an observation magnification (measurement magnification), and its scanning range is controlled. A two-stage deflection coils (image shift coils) 32 are disposed in the same position as the scanning coil 9. If the beam is inclined, then the position of the primary electron beam 4 which is incident on the object lens 7 can be controlled two-dimensionally by a beam position control power supply 31 so as to cause an object point of the object lens 7 to become a deflection fulcrum. In its turn, a scanning region (observation visual field) of the primary electron beam 4 on the sample 10 can be moved two-dimensionally.

The sample stage 15 can move the sample 10 in at least two directions (X direction and Y direction) in a plane perpendicular to the primary electron beam 4 according to a movement mechanism which is added to the sample stage 15 and which is not illustrated.

On the other hand, a secondary signal (sample signal) 12 including secondary electrons generated from the sample 10 by irradiation using the primary electron beam 4 is advanced to an upper part of the object lens 7, separated from the primary electrons according to energy difference by an orthogonal electromagnetic field generation device 11 for secondary signal separation, advanced in a direction of a secondary signal detector 13, and detected by the secondary signal detector 13. The signal detected by the secondary signal detector 13 is amplified by a signal amplifier 14, subjected to A/D conversion in an A/D converter which is not illustrated, and taken in the computer 40 as occasion demands.

As described above, the scanning electron microscope 100 according to the present embodiment includes an electro-optical system for generating the primary electron beam 4 having the predetermined emission current by using the cathode 1 and the first and second anodes 2 and 3, and scanning and irradiating the sample 10 placed on the movable sample stage 15 by the primary electron beam 4, and a detection system for separating the sample signal by using the orthogonal electromagnetic field generation device 11 and detecting the sample signal by using the secondary signal detector 13.

On the other hand, a detected signal taken in the computer 40 from the secondary signal detector 13 is converted to image information of the sample image by image generation means in the computer 40, in synchronism with scanning on the sample 10 using the primary electron beam 4 conducted by the scanning coil 9. The image information of the sample image subjected to the conversion process is successively transferred to a display image memory 25 and generated as an output.

The image information of the sample image generated and output to the display image memory 25 is converted to a video signal by display control means formed in the computer 40. The video signal is supplied to an image display device 26. The sample image is displayed on the image display device 26 as a moving picture as occasion demands.

By using an input-output device 42, various kinds of setting for the scanning electron microscope 100 can be input. For example, selection of a recipe, specifying and changing basic information required for execution of the automatic observation process in the recipe such as an alignment point position, a measurement point position and a measurement magnification in the selected recipe, specifying and changing a template which serves as a guide in detecting an accurate position and dimension of a measurement point required to execute the automatic observation process, and specifying reproduction of a recorded and stored image at the time when an error has occurred as described later are input. Furthermore, the input-output device 42 has a configuration capable of conducting output display of various kinds of information (such as a sample image of a measurement subject, measurement conditions, a measurement result, and error information) acquired as the automatic observation process is executed. When an error is caused by execution of the automatic observation process, therefore, information of the error is displayed. The input-output device 42 includes, for example, an operation input device such as a keyboard and a mouse connected to the computer 40 and a display device.

Recipes for causing the scanning electron microscope 100 to conduct the automatic observation process are registered in a recording device 41. In addition, various kinds of information (such as the above-described sample image of the measurement subject, measurement conditions, the measurement result, and error information) previously specified to be acquired is stored in accordance with an algorithm of an automatic observation process according to a selected recipe.

In the present embodiment, the computer 40 functions as automatic observation control means for taking in a recipe stored in the recording device 41, and controlling operation of the electro-optical system and executing an automatic observation process of the sample by using the detection system in accordance with the recipe, besides the above-described image generation means and the display control means. Furthermore, since the computer 40 acquires image information of the sample image specified to be acquired in order to execute an individual automatic process in accordance with an algorithm of the automatic observation process, exercises control to store the acquired image information of the sample image in the recording device 41 as one of the above-described various kinds of information, and exercises control to store an error moving picture described later in a recording device 44, the computer 40 functions as recording control means as well. And the recording device 41 functions as automatic observation result recording means for recording various kinds of information, such as the image information of the sample image, measurement conditions, the measurement result, and information of an error caused during execution, specified to be acquired to execute an individual automatic process by an algorithm when the automatic observation process is executed.

A configuration for recording the sample image (error moving picture) when an error has occurred during the execution of the automatic observation process according to a recipe in the scanning electron microscope 100 according to the present embodiment will now be described.

The scanning electron microscope 100 according to the present embodiment includes a recording device 43 serving as image storage means for successively storing sample images generated and output to the display image memory 25 by the image generation means in the computer 40 and recording sample images corresponding to a predetermined video quantity (for example, t1 in total recording time period) while successively conducting overwriting, and the recording device 44 serving as error image recording means for storing the sample image (error moving picture) at the time of error occurrence.

Figure 2:
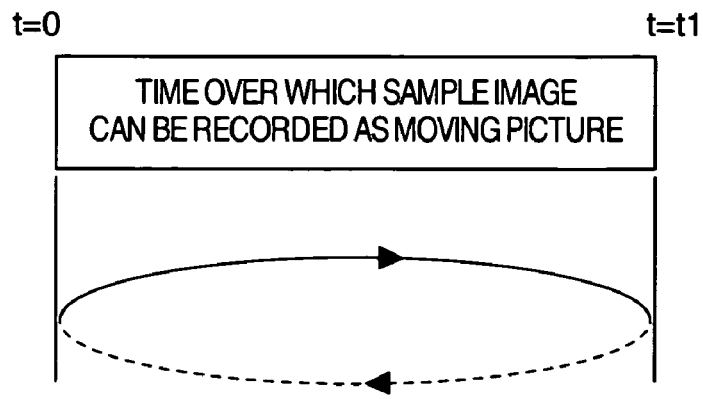
FIG. 2 is a diagram showing a recording configuration of a recording device which serves as image storage means in the scanning electron microscope according to the embodiment.

FIG. 2 is a diagram showing a recording configuration of the recording device serving as the image storage means in the scanning electron microscope according to the present embodiment.

In the present embodiment, the recording device 43 includes a storage medium such as a semiconductor memory or a hard disk drive, and has a recording capacity capable of recording the moving picture of the sample image as a moving picture by the total time period t1.

The image information of the sample image generated and output to the display image memory 25 to be supplied to the image display device 26 which displays the sample image as a moving picture as occasion demands is successively stored in the recording device 43 by the computer 40 which functions as the recording control means as well as described above. The image information is recorded in the recording device 43 by a predetermined video quantity (for example, by t1 in total recording time period) while being successively overwritten. Specifically, in order to continue to record latest image information of the sample image in the recording device 43 capable of storing a finite video quantity, image information of the sample image recorded at new time is written over image information of the sample image recorded at the oldest time (image information of the sample image recorded t1 before) when a recording capacity that can be recorded by the recording device 43 (the video quantity corresponding to t1 in total recording time period) is reached. This operation is repeated as shown in FIG. 2. As a result, recording restrictions of the image information of the sample image caused by the recording capacity of the recording device 43 are removed.

The recording capacity required of the recording device 43 changes depending upon a difference of basic information in a recipe of the automatic observation process executed by the computer 40 serving as the automatic observation control means in accordance with the recipe. In the present embodiment, it is also possible to set the maximum total recording time period shorter than the predetermined video quantity (for example, t1 in total recording time period) of the recording device 43 according to the need for confirming the error process by using the input-output device 42.

If a recording capacity of the recording device 43 corresponding to t1 in total recording time period cannot be ensured because of the image information quantity of one frame of the sample image concerning the size and complexity of the observed surface of the sample, then setting can be changed so as to be able to ensure the total recording time period t1 without changing the recording capacity of the recording device 43 by changing a sampling rate st of the image information of the sample image generated and output to the display image memory 25 which successively stores image information while the image information is being overwritten in the recording device 43 by the computer 40 and thereby adjusting the number of acquired frames of the image per unit time period (second).

For example, acquisition of image information of the sample image which has been acquired to execute an individual automatic process until then is stopped on the basis of a certain acquisition stop instruction contained in an algorithm of an automatic observation process according to a recipe. And recording of the image information of the sample image into the recording device 41 is stopped at time ts1. Acquisition of the image information of the sample image is newly started on the basis of an acquisition instruction to execute another individual automatic process. And recording of the image information of the sample image into the recording device 41 is resumed. Thereafter, the acquisition of the image information of the sample image is stopped again on the basis of a subsequent acquisition stop instruction. And recording of the image information of the sample image into the recording device 41 is stopped at time ts2. If the recording capacity (t1 in total recording time period) of the recording device 43 is just enough to store the image information of the sample image generated and output to the display image memory 25 over a period between ts1 and ts2 (for example, over a period between individual automatic processes in the series of sequences (1) to (5) described in BACKGROUND OF THE INVENTION), then it becomes possible to cope with occurrence of an error by retroceding to time when it was confirmed that no errors occurred, and recording the image information of a series of sample images as a moving picture, while suppressing the increase of the recording capacity of the display image memory device 43. Therefore, details resulting in the error occurrence (error process) can be confirmed more easily.

On the other hand, the recording device 44 includes a recording medium, for example, such as a hard disk drive. The recording device 44 has a recording capacity capable of recording the sample image (moving picture) over a total time period t3 (where t3>>t1) when an error has occurred. As a result, the sample image (moving picture) when an error for which confirmation of the error process is already finished has occurred can also be used to confirm an error process concerning an error that has newly occurred.

It is now supposed that the computer 40 in the scanning electron microscope 100 according to the present embodiment calls a recipe stored in the recording device and an error has occurred while the computer 40 is executing the automatic observation process in accordance with the recipe. It is also supposed that the scanning electron microscope 100 is executing the CD measurement process as the automatic observation process.

Figure 3:
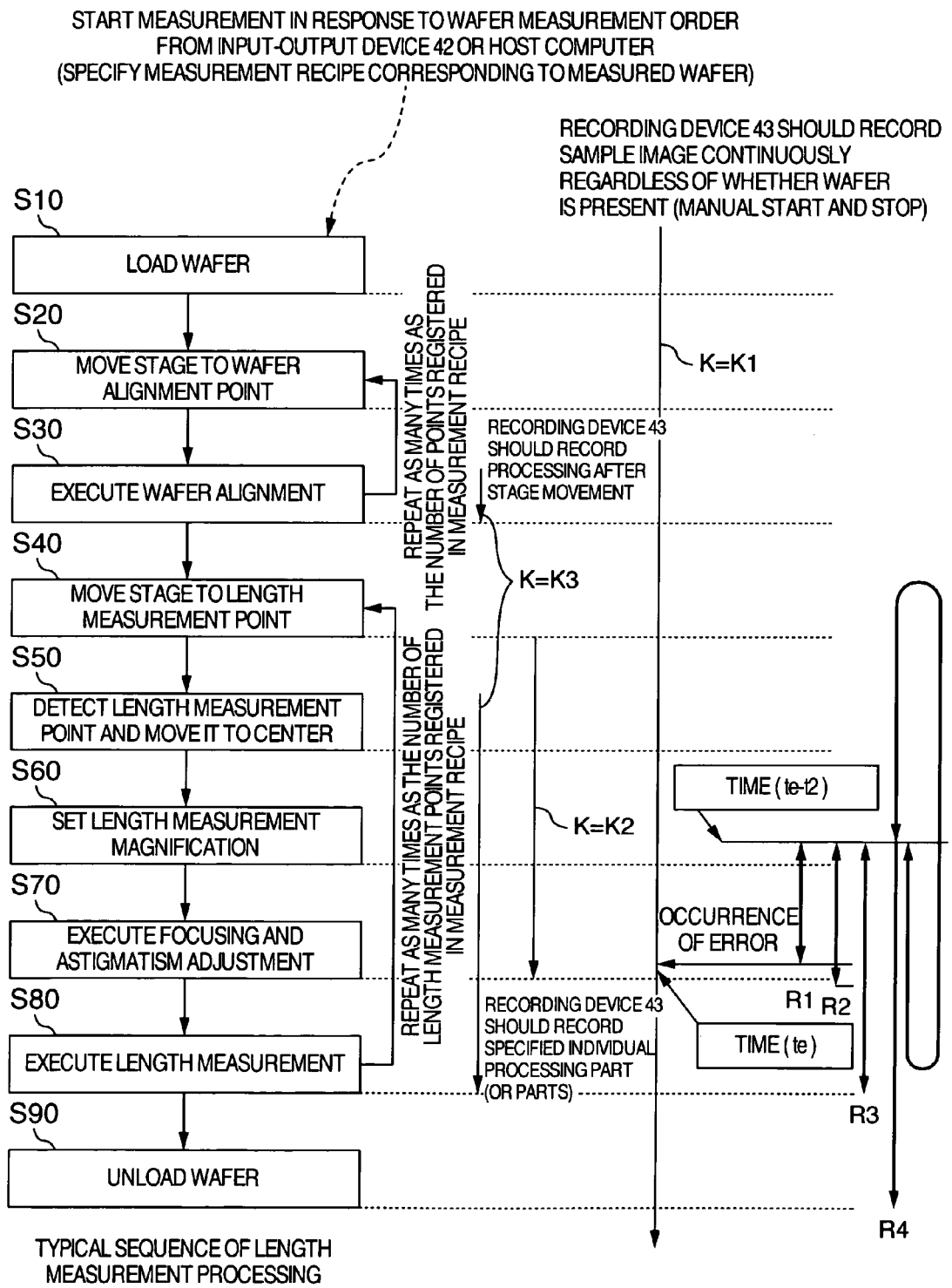
FIG. 3 is a flow chart of a sequence example of a CD measurement process using the scanning electron microscope according to the embodiment.

FIG. 3 is a flow chart showing an embodiment of a sequence of the CD measurement process using the scanning electron microscope according to the present embodiment.

The computer 40 in the scanning electron microscope 100 starts execution of a CD measurement process according to a measurement recipe specified by a user's order given from the input-output device or by a host computer which is not illustrated. Thereupon, a carry-in and carry-out mechanism which is not illustrated is operated on the sample stage 15 in a sample chamber, and a wafer (sample) 10 having a chip formed thereon is carried in (wafer load) (step S10). And the scanning electron microscope 100 moves the sample stage 15 having the wafer 10 placed thereon to an alignment point (wafer alignment point) (step S20). Alignment (wafer alignment) is executed (step S30). The movement to the alignment point (step S20) and the alignment (step S30) are executed repetitively as many times as the number of alignment points registered in the measurement recipe.

Subsequently, the scanning electron microscope 100 controls the movement of the sample stage 15 having the wafer 10 placed thereon (step S40), conducts coarse detection of a length measurement point of the wafer 10 registered in the measurement recipe at low magnification, and positions the coarsely detected length measurement point in a center within a scanning range (observation range) of the primary electron beam 4 (step S50). And the scanning electron microscope 100 sets the length measurement magnification (high magnification) registered in the measurement recipe (step S60), and executes focusing and astigmatism of the object lens 7 so as to obtain a scanning image at the length measurement point with an optimum beam diameter of the primary electron beam 4 (step S70). Thereafter, the scanning electron microscope 100 executes the length measurement by using a template registered in the measurement recipe on the basis of a sample image at the length measurement point acquired at that time (step S80).

Upon finishing a series of individual automatic processes ranging from the movement control of the sample stage 15 (step S40) to the length measurement at the length measurement point (step S80) as many times as the number of length measurements registered in the measurement recipe, the scanning electron microscope 100 carries out the wafer (i.e., one wafer) 10 from the sample stage 15 in the sample chamber (wafer unloading), and terminates the CD measurement process according to the measurement recipe concerning the wafer 10 (step S90).

It is now supposed that an error is caused in the execution of the CD measurement process by a situation of (a) the sequence, (b) the image, (c) operation of the recipe, or (d) the image or hardware. A recording process of the sample image (error moving picture) conducted by the scanning electron microscope 100 in this case will now be described. Supposing that an error is caused in the "focusing and astigmatism adjustment" process at step S70 by any of (a) to (d), the recording process will now be described.

In the scanning electron microscope 100 according to the present embodiment, the computer 40 serving as the image generation means converts a detected signal supplied from the secondary signal detector 13, successively transfers the detected signal to the display image memory 25, and generates and outputs the sample image, during the operation of the started image generation means, regardless of whether the wafer (sample) 10 is placed on the sample stage 15. The computer 40 serving as the recording control means records the sample image corresponding to the predetermined video quantity (for example, t1 in total recording time period) while successively transferring and overwriting the sample image. Therefore, the recording device 43 has always the latest generated sample image corresponding to the predetermined video quantity stored therein.

In FIG. 3, an example of a section in which the newly generated sample image is successively recorded in the recording device 43 and only the sample image corresponding to the predetermined video quantity (for example, t1 in total recording time period) is recorded while being overwritten is denoted by an arrow K. As for the section K, a desired process portion such as K1 to K3 can be specified from the input-output device 42 in the scanning electron microscope 100 according to the present embodiment. For example, in the CD measurement process according to the measurement recipe of the scanning electron microscope 100, it is not necessary in some cases to preserve especially an error image as a moving picture in duplication as regards an error already known to occur before execution of the process. By adopting a configuration capable of specifying a process portion, such as the section K1, K2 or K3 shown in FIG. 3, over which the sample image corresponding to the predetermined video quantity is recorded in the recording device 43, from the input-output device 42, therefore, the recording of the sample image that is not needed to analyze the cause of a failure on the basis of the error image into the recording device 43 can be omitted. By adopting a configuration in which narrowing down to a process portion that needs to be analyzed is conducted and only the error image thereof is recorded in the recording device 43, it becomes possible to analyze the failure cause more easily and rapidly. In FIG. 3, the section K1 represents the case where it is specified from the input-output device 42 to always record the latest sample image corresponding to the predetermined video quantity while the computer 40 serving as the image generation means is in operation regardless of whether the wafer (sample) 10 is on the sample stage 15. The section K2 represents the case where a desired individual automatic process (in the illustrated case, a plurality of individual automatic processes in the range of steps S50 to S70) in the series of sequences is specified. The section K3 represents the case where a process after movement of the sample stage 15 is specified. Besides, although omitted in FIG. 3, a section K over which the sample image corresponding to the predetermined video quantity is recorded in the recording device 43 can be specified by specifying a desired measurement recipe and specifying a desired time and a time period only in the state in which a CD measurement process according to the specified measurement recipe is being executed. In the ensuing description, it is supposed that the section K1 is specified from the input-output device 42 as the section K over which the sample image corresponding to the predetermined video quantity is recorded in the recording device 43.

Figure 4:
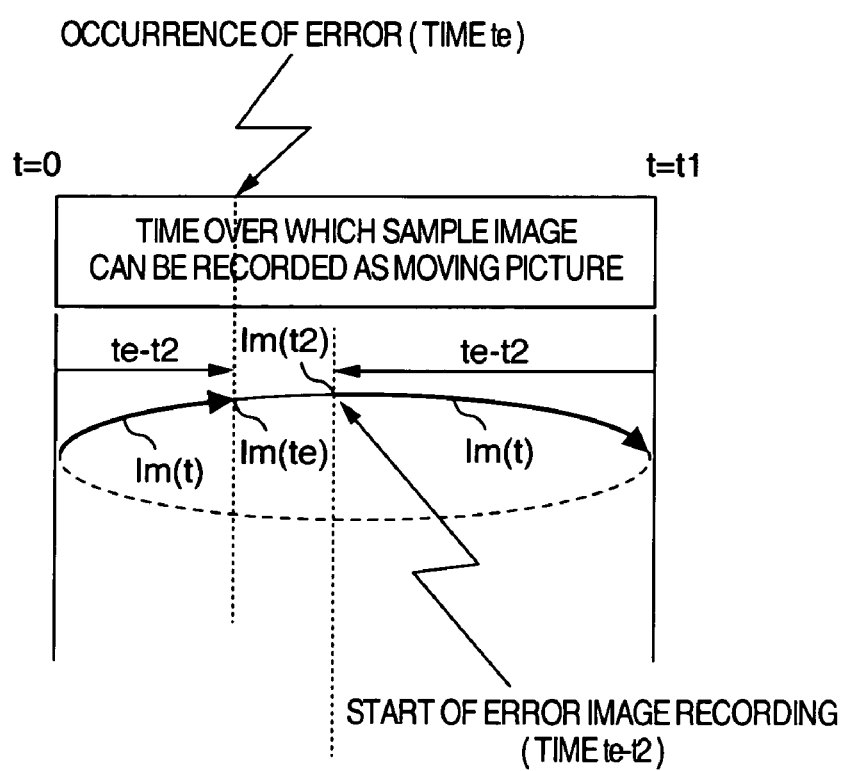
FIG. 4 is a diagram showing a recording configuration for recording an error image in the scanning electron microscope according to the embodiment into error image recording means.

If an error is caused by any of (a) to (d) at time te in FIG. 3, i.e., while the computer 40 is executing the "focusing and astigmatism adjustment" process at the step S70 in accordance with the measurement recipe, then the computer 40 serving as the recording control means in the scanning electron microscope 100 records information of a series of sample images stored in the recording device 43 corresponding to t2 (where $t1 \geqq t2$) in the recording device 44 serving as the error image recording means as an error image as shown in FIG. 4.

FIG. 4 is a diagram showing a recording configuration for recording an error moving picture into the error image recording means in the scanning electron microscope according to the present embodiment.

If the computer 40 detects occurrence of an error that might have been caused by any of (a) to (d) on the basis of, for example, an abnormality in the execution state of the "focusing and astigmatism adjustment" process in the CD measurement process according to a recipe, then the computer 40 extracts a sample image Im(t2) obtained by retroceding from a sample image Im(te) stored so as to be associated with the time te of the error occurrence by a predetermined video quantity (for example, total recording time period t2) previously set and registered by the input-output device 42, from the sample image stored in the recording device 43. In addition, the computer 40 adds a sample image recorded after the time te to the sample image Im(t2) as occasion demands, and stores a resultant sample image in the recording device 44.

As a result, a sample image Im(t) started at time (te-t2) which precedes the error occurrence time te by a previously set and registered predetermined video quantity (for example, the total recording time period t2) is recorded in the recording device 44 as an error moving picture.

The video quantity previously set and registered by the input-output device 42 (for example, the total recording time period t2), i.e., retroactivity for the error occurrence time can be arbitrarily set from the input-output device 42 under the condition that t1>t2 on the basis of the recording capacity (the total recording time period t1) of the recording device 43.

In an automatic observation process according to a recipe, recording of image information into the recording device 41 is stopped at time ts1 on the basis of one acquisition stop instruction contained in the algorithm. And recording of the image information of the sample image into the recording device 41 started on the basis of the next acquisition instruction is stopped at time ts2 on the basis of the next acquisition stop instruction. If the retroactivity (t2 in total recording time period) toward the error occurrence time is just enough to store the image information of the sample image generated and output to the display image memory 25 over a period between ts1 and ts2 (for example, over a section between individual automatic processes in the series of sequences (1) to (5) described in BACKGROUND OF THE INVENTION), then advantageously it becomes possible to cope with occurrence of an error by retroceding to time when it was confirmed that no errors occurred, and recording the image information as a moving picture of a series of sample images. Typically, however, the retroactivity (t2 in total recording time period) is set at least nearly to a time period required for measurement (observation) of one length measurement point (observation point).

In FIG. 3, R1, R2, R3 and R4 indicate examples of end time of recording of the error moving picture into the recording device 44 in the case where an error has occurred at time te. In the error image recording example R1, the sample image is recorded into the recording device 44 as the error moving picture between time (te-t2) and the time te. In the error image recording example R2, the sample image is recorded into the recording device 44 as the error moving picture between the time (te-t2) and time when an individual automatic process (the "focusing and astigmatism adjustment" process in the case of FIG. 3) in which an error has occurred is finished. In the error image recording example R3, the sample image is recorded into the recording device 44 as the error moving picture between the time (te-t2) and time when measurement (observation) of a measurement point (observation point) in which an error has occurred is finished. In the error image recording example R4, the sample image is recorded into the recording device 44 as the error moving picture between the time (te-t2) and time when the CD measurement process (observation process) of a sample in which an error has occurred is finished. In this way, the recording end timing of the error moving picture can be arbitrarily set. In the present embodiment, the recording end timing of the error moving picture can be arbitrarily set from the input-output device 42 in the same way as the retroactivity (t2 in total recording time period).

When recording a series of error moving pictures obtained when an error has occurred into the recording device 44 in the scanning electron microscope 100 according to the present embodiment, the computer 40 links the series of error moving pictures and various kinds of information (such as the sample image of the measurement subject, measurement condition, measurement result and error information) acquired by execution of the CD measurement process, to each other and stores them in the recording devices 41 and 42.

A configuration for confirming a cause of an error which has occurred in the CD measurement process conducted by the scanning electron microscope 100 according to the present embodiment will now be described.

FIG. 5 shows an embodiment of an error monitor view displayed by the scanning electron microscope according to the present embodiment when automatic length measurement in the CD measurement process has failed.

If the automatic length measurement has failed in the CD measurement process conducted by the scanning electron microscope 100, then information of an error that has occurred during execution of the CD measurement recorded into the recording device 41 by the computer 40, if any, is window-displayed on an error monitor view 60 on a screen of a display device, which forms the input-output device 42 in conjunction with the operation input device such as the keyboard and the mouse, automatically after the end of the CD measurement process or in response to a predetermined manual operation of the input-output device 42.

In the case of the example shown in FIG. 5, a generated error display part 62 which can be scrolled in display, and operation buttons 64 such as Video, Detail, Clear and Close buttons are displayed. As regards all error information generated during execution of the last CD measurement process, the last generated error list having an error code or an error summary as an index is displayed in the generated error display part 62 on the basis of error information stored in the recording device 41.

In the state in which a desired error list item selected from the last generated error list is active-displayed, the user operates the Video button or double-clicks the mouse. As a result, a video start image of a sample image (error image) associated with the linked error list item is displayed, and a menu 66 for moving picture reproduction such as "video play," "rewind" and "fast feed" shown in FIG. 6 is displayed. And it becomes possible to video-display the error image.

FIG. 6 shows an embodiment of a moving picture reproduction menu view of an error image in the scanning electron microscope.

The case where a desired error image selected from among all errors generated in the automatic observation process conducted by the scanning electron microscope 100 until then is displayed as a moving picture will now be described.

FIG. 7 shows an error log display view of all errors that have occurred in the automatic observation process conducted using the scanning electron microscope according to the present embodiment.

An error log display view 70 showing all errors is utilized when, for example, the user determines, as to a cause of an error that has newly occurred, whether a similar error that is likely to be helpful is contained in all errors that have occurred in the automatic observation process until then. When the user has conducted a predetermined operation on the operation input device in the input-output device 42, the error log display view 70 is window-displayed on the screen of the display device in the input-output device 42 by the computer 40. The error log display view 70 includes an error history display portion 72 which is scroll-displayed, a retrieval condition input portion 74 for setting and inputting a retrieval condition, and buttons 76 such as Video, Print and Help buttons. In the error history display portion 72, a list of indexes of all errors that have occurred in the automatic observation process..until then is displayed on the basis of all error information stored in the recording device 41. For example, as index display items of each error history, an error code, an error occurrence place, and an error occurrence date and time are displayed. While directly referring to the error history displayed in the error log display view 70, the user inputs one or more desired index display items to the retrieval condition input portion 74 as a retrieval item, selects a desired error history, and brings the selected error history into an active display state. In that state, the user operates the Video button or double-clicks the mouse. As a result, a video start image of a sample image associated with the linked error is displayed, and the menu 66 for moving picture reproduction such as "video play," "rewind" and "fast feed" shown in FIG. 6 is displayed. And it becomes possible to video-display the sample image of the error.

For confirming the cause of the error that has occurred in the CD measurement process conducted as the automatic observation process of this time in the scanning electron microscope 100 according to the present embodiment, the user first specifies an error to be confirmed from among errors that have occurred this time by using the error monitor view 60, and operates its Video button.

As a result, information of the sample image at the time when the error has occurred is called from the recording device 44 into the computer 40. The information is displayed on the screen of the display device in the input-output device 42 as a moving picture by a moving picture reproduction function provided in the computer 40.

And the user grasps a problem place by reproducing the moving picture of the sample image obtained when this error has occurred. Thereafter, the error log display view 70 is displayed. By directly referring to the error history displayed in the error history display portion 72, or inputting one or more desired index display items to the retrieval condition input portion 74 as retrieval items, the user selects a desired error history and operates the Video button.

As a result, information of the sample image at the time when the error in the error history has occurred is called from the recording device 44 into the computer 40. The information is displayed on the screen of the display device in the input-output device 42 as a moving picture by the moving picture reproduction function provided in the computer 40.

While comparing the moving picture of the error to be confirmed with the moving picture of the error in the error history, the user can confirm the cause of the error that has newly occurred and execute its analysis process.

The scanning electron microscope 100 according to the present embodiment has the configuration heretofore described. However, the embodiment of the scanning electron microscope according to the present invention is not limited to the configuration heretofore described.

For example, the recording of the error image at the time of error occurrence in the automatic observation process is started from the sample image acquired t2 (where $t1 \geq t2$) before the time of the error occurrence, on the basis of the recording capacity (for example, t1 in total recording time period) of the recording device 43. However, this is not restrictive. For example, the sample image started in acquisition when the error has occurred can be put forward and put back in time, by suitably increasing the recording capacity of the recording device 43, or by changing a sampling rate st of the image information of the sample image generated and output to the display image memory 25 as described above without changing the recording capacity of the recording device 43. As a matter of course, the sample image started in acquisition when the error has occurred can also be put forward and put back in time, by increasing or decreasing the recording capacity itself of the recording device 43.

In addition, instead of determining the sample image itself started in acquisition by unique retroactivity based on time predetermined on the basis of the error occurrence time, the user may specify acquisition start directly from the input-output device 42. According to this, irrespective of difference in measurement point between measurement recipes, for example, a time period between the movement to the first length measurement point at the step S40 shown in FIG. 3 and the completion of the length measurement at the last length measurement point conducted at the step S80 may also be specified. For example, in both the case of a wafer 10 in which an error is caused in the length measurement at the first length measurement point and the case of another wafer 10 in which an error is caused in the length measurement at the last length measurement point, therefore, error images having the same section length can be generated regardless of difference in error occurrence time. In this way, it becomes possible to preserve the past error image by intentionally specifying a range. Therefore, it becomes possible to create, for example, a manual of a measurement procedure by using a video image. As regards the behavior of the video image containing a time variation such as image shaking, it also becomes possible to register it in the recording device 44 as a color image file.

In the scanning electron microscope 100 according to the present embodiment, the recording device 41 and the recording device 44 are formed as separate recording devices. Alternatively, the recording device 41 and the recording device 44 may be formed in the same recording device. Furthermore, in the scanning electron microscope 100 according to the present embodiment, the recording device 43 serving as the image storage means and the recording device 44 serving as the error image storage means are formed as separate recording devices. Alternatively, the recording device 43 serving as the image storage means may be formed in a predetermined recording region ensured in the recording device 44 serving as the error image storage means.

In the scanning electron microscope 100 according to the present embodiment, information of the sample image generated by the image generation means in the computer 40 and transferred to the display image memory 25 in order to be supplied to the image display device 26 is recorded in the recording device 43 serving as the image storage means. Alternatively, a predetermined window portion that can be previously selected from display information of an original display view, which includes a display portion based on the information of the sample image transferred to the display image memory 25 and which is displayed on the display device in the input-output device 42 during execution of the automatic observation process, may be cut out, and stored instead of the information of the sample image stored in the display image memory 25, when an error has occurred.

FIG. 8 is a diagram of an embodiment of the original display view displayed on the display device in the input-output device during the execution of the automatic observation process.

As for an original display view 80, the whole original display view 80, a length measurement view main body portion 82, which is similar to the view displayed on the image display device 26 and which is included in the original display view 80, and a length measurement view portion 84, which is obtained by adding display information such as measurement conditions and predetermined operation buttons to the length measurement view main body portion 82, can be recorded in the recording device 43 and the recording device 44 in accordance with user's selection.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope including
an electro-optical system for scanning and irradiating top of a sample with an electron beam;
a detection system for detecting a signal generated from a sample by the scanning and irradiation with the electron beam conducted by the electro-optical system; and
automatic observation control means for controlling operation of the electro-optical system and executing an automatic observation process of the sample by using the detection system in accordance with a previously registered recipe,
the scanning electron microscope comprising:
image generation means for generating a sample image on the basis of a detected signal supplied from the detection system;
image storage means for successively storing the sample image generated by said image generation means, and recording the sample image corresponding to a predetermined video quantity while successively overwriting the sample image;
error image recording means for recording the sample image transferred from said image storage means; and
recording control means responsive to an error in execution conducted by the automatic observation control means, for retroceding in the sample image successively stored in said image storage means before occurrence of the execution error included in the sample image successively stored in said image storage means, from time of the occurrence of the execution error by a predetermined video quantity, and recording the sample image in said error image recording means.

2. A scanning electron microscope according to claim 1, wherein when retroceding from the occurrence time of the error, which has occurred during execution conducted by the automatic observation control means, by a predetermined video quantity, and recording the sample image in said error image recording means, said recording control means records the sample image in association with recording of observation conditions of the automatic observation process that is being executed at the time of error occurrence of the execution conducted by the automatic observation control means.

3. A scanning electron microscope according to claim 1, wherein when retroceding from the occurrence time of the error, which has occurred during execution conducted by the automatic observation control means, by a predetermined video quantity, and recording the sample image in said error image recording means, said recording control means records the sample image in association with recording of error information concerning the execution error that has occurred.

4. A scanning electron microscope according to claim 1, further comprising perusal control means for reading out the sample image recorded in said error image recording means and supplying a reproduced output of the sample image to display means.

5. A scanning electron microscope according to claim 3, further comprising perusal control means for reading out a sample image corresponding to specified error information from among sample images recorded in said error image recording means, and supplying a reproduced output of the sample image to display means.

6. A storage medium storing a program to receive image data transmitted from a scanning electron microscope and control a scanning electron microscope control device for storing the image data, the program executing a sequence comprising the steps of:

storing a plurality of images transmitted from the scanning electron microscope;

receiving an error signal transmitted from the scanning electron microscope; and selectively storing a predetermined number of images stored before receiving the error signal as an error monitor image.

* * * * *